United States Patent
Wirtzberger et al.

(10) Patent No.: US 7,791,865 B2
(45) Date of Patent: Sep. 7, 2010

(54) ELECTRONIC SYSTEM HAVING A RELEASE CONTROL AND METHOD

(75) Inventors: Paul A. Wirtzberger, Greeneville, TX (US); Steven Belson, Plano, TX (US); Martha G. Peterson, McKinney, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 863 days.

(21) Appl. No.: 11/196,955

(22) Filed: Aug. 4, 2005

(65) Prior Publication Data

US 2007/0047180 A1 Mar. 1, 2007

(51) Int. Cl.
- H05K 5/00 (2006.01)
- H05K 7/00 (2006.01)
- H02B 11/12 (2006.01)
- H01H 9/20 (2006.01)

(52) U.S. Cl. .................. 361/679.01; 361/608; 361/728; 200/50.26

(58) Field of Classification Search .............. 200/50.26, 200/50.27; 361/608, 609, 654, 732, 740, 361/741, 747, 728, 736, 737, 679, 679.01; 439/680

See application file for complete search history.

(56) References Cited

U.S. PATENT DOCUMENTS

| | | | | |
|---|---|---|---|---|
| 2,858,389 | A * | 10/1958 | Cuorato et al. ........... | 200/50.26 |
| 2,959,714 | A * | 11/1960 | Yarrick ........................ | 361/608 |
| 3,644,873 | A * | 2/1972 | Dalton et al. ................ | 439/299 |
| 3,932,716 | A * | 1/1976 | Mottel et al. ............. | 200/50.02 |
| 4,071,722 | A * | 1/1978 | Hart .......................... | 200/50.1 |
| 4,125,305 | A * | 11/1978 | Kasindorf ................ | 312/332.1 |
| 4,317,160 | A * | 2/1982 | Tillson et al. ................ | 361/609 |
| 4,491,896 | A * | 1/1985 | Rickmann .................... | 361/609 |
| 5,428,523 | A * | 6/1995 | McDonnal .................... | 363/71 |
| 5,612,854 | A * | 3/1997 | Wiscombe et al. .......... | 361/727 |
| 5,640,061 | A * | 6/1997 | Bornhorst et al. ........... | 307/150 |
| 5,909,065 | A * | 6/1999 | Jones et al. .............. | 439/924.1 |
| 5,969,938 | A * | 10/1999 | Byrne et al. ................. | 361/678 |
| 6,005,208 | A * | 12/1999 | Castonguay ................ | 200/308 |
| 6,006,298 | A * | 12/1999 | Satoh ......................... | 361/816 |
| 6,147,878 | A * | 11/2000 | Heselton ..................... | 361/798 |
| 6,293,828 | B1 * | 9/2001 | Colver et al. ................ | 439/680 |
| 6,762,934 | B2 * | 7/2004 | Kitchen et al. ......... | 361/679.58 |
| 6,952,349 | B2 * | 10/2005 | Gough et al. ............... | 361/741 |
| 7,269,024 | B2 * | 9/2007 | Striano ....................... | 361/759 |
| 7,397,670 | B2 * | 7/2008 | Su ............................. | 361/728 |
| 2004/0150973 | A1 * | 8/2004 | Junkins et al. .............. | 361/801 |

* cited by examiner

*Primary Examiner*—Jayprakash N Gandhi
*Assistant Examiner*—Adrian S Wilson

(57) ABSTRACT

Various embodiments of an electronic system and method for removing a power module from an electronic system are provided. The electronic system includes a power module that supplies power to a load and is movable along an axis from an enabling position to a disconnected position. The electronic system also includes a release control that restricts the movement of the power module along the axis when the power module is moved beyond a disabling position located between the enabling position and the disconnected position.

14 Claims, 5 Drawing Sheets

ELECTRONIC SYSTEM HAVING A RELEASE CONTROL AND METHOD

BACKGROUND

Applications that use an electronic system requiring considerable amounts of power, such as for example computer networking systems, typically include two or more power modules to supply power to a load. The power modules generally having independent circuitry, are hot-swappable so that if any one of the power modules needs to be removed for repair or replacement, the electronic system can remain powered on while the power modules are removed and replaced.

A problem exists, however, in that if one of the power modules has to be removed, a sudden drop in the power supply to the load can occur. Although the remaining power modules of the electronic system can compensate for the current supplied by the removed power module, the remaining power modules are typically unable to compensate quickly enough to the sudden drop in supplied power. The sudden drop in the power supply to the load as a result of the power module being removed can cause the output voltage provided by the remaining power modules to dip before a full recovery can occur. The voltage dip can cause certain components in the electronic system to shut off, which may cause a crash of the electronic system.

BRIEF DESCRIPTION OF THE SEVERAL VIEWS OF THE DRAWINGS

The various embodiments of the present invention can be understood with reference to the following drawings. The components in the drawings are not necessarily to scale. Also, in the drawings, like reference numerals designate corresponding parts throughout the several views.

DETAILED DESCRIPTION

Figure 1:
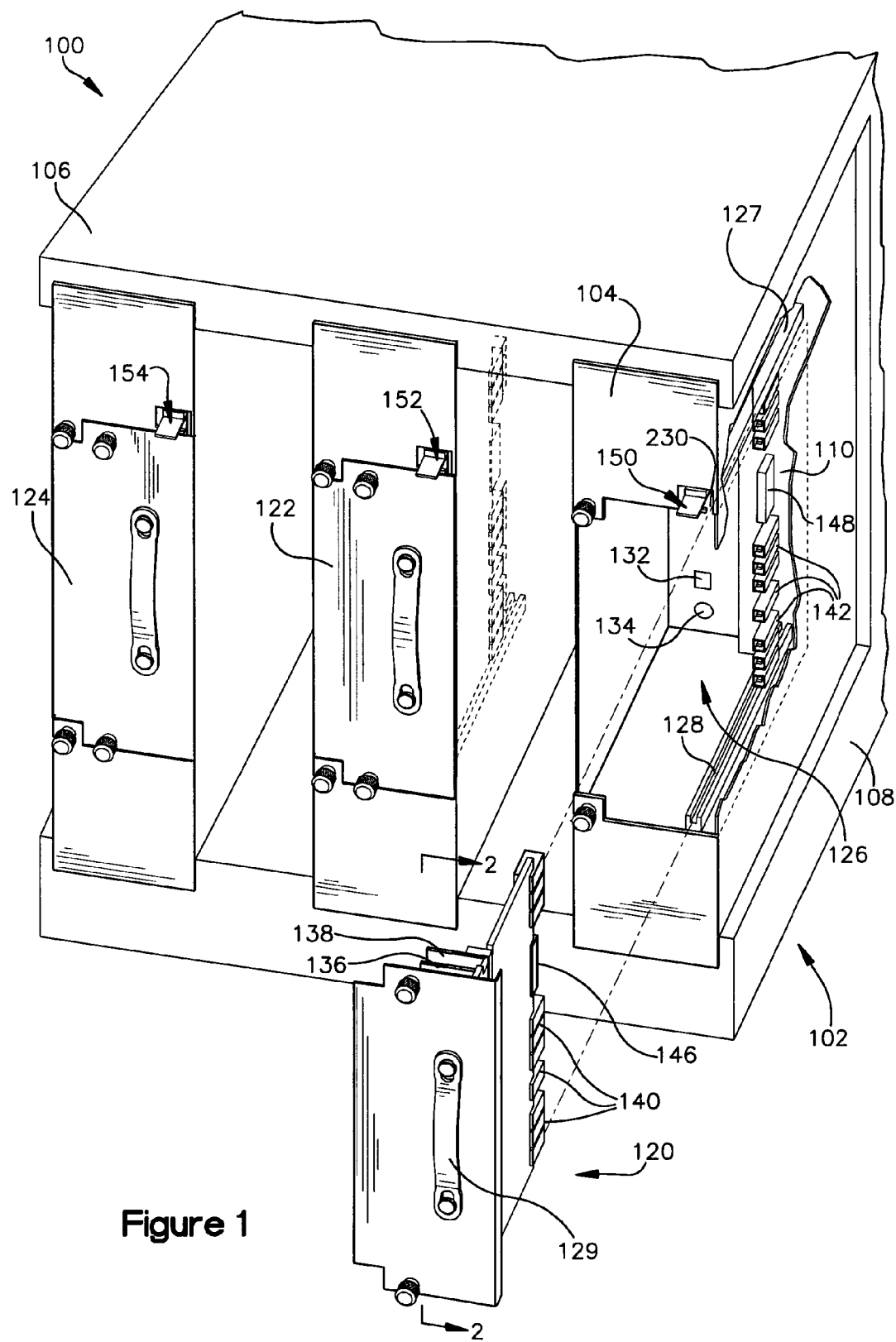
FIG. 1 is a perspective view of a portion of an electronic system that includes a plurality of power modules according to an embodiment of the present invention.

FIG. 1 shows a perspective view of a portion of an electronic system 100 according to an embodiment of the present invention. For convenience, the electronic system 100 is described within the environment of a server used in, for example, a telecommunications system, however one of ordinary skill in the art can appreciate that embodiments of an electronic system could be used in other applications, for example, other computers and computer networking environments. Electronic system 100 includes a chassis 102, having a front panel 104, top panel 106, and side wall 108, any of which can be attached to the chassis 102 or integral with the chassis 102. Electronic system 100 also includes a backplane 110 which can be connected to or integral with the chassis 102.

Electronic system 100 includes two or more power modules, for example power modules 120, 122, and 124. The power modules 120, 122, 124, can be, for example, printed circuit cards populated with electronic components. The backplane 110 is typically the medium through which internal routing is placed for intercomponent communications of the power modules 120, 122, 124, to each other and to the load (not shown) which can be located on the opposite side of the backplane 110.

Chassis 102 of electronic system 100 has a slot for accommodating each power module, such as, for example slot 126 for receiving power module 120. The slots such are defined by guides, for example slot 120 is defined by top guide 127 and bottom guide 128 of chassis 102. Power modules 120, 122, 124 can be inserted and removed by pushing or pulling handle 129 or faceplate 130 of power module 120 into slot 126. The outside edges of the power modules slide along the guides 127, 128 enabling direct electrical interface of the power modules with the backplane 110 inside the chassis 102 upon full insertion.

Power is distributed along the backplane 110 of the chassis 102 which is supplied to electronic components residing within the electronic system including the load. Central processing units (CPUs) 132 and memory modules 134, and other electronic components can be mounted on the backplane 110 and electrical components such as converters 136, 138, can be mounted on power module 120, and will be further described below. Power module 120 includes a plurality of output voltage connectors 140 which connect into a plurality of output voltage receptors 142 along backplane 110, and a signal connector 146 which connects into signal receptor 148 along backplane 110.

The electronic system 100 shown in FIG. 1 has three power modules 120, 122, 124, however, in alternative embodiments, fewer or additional power modules can be present. Redundancy provided by the multiple power modules enables continued operation of the electronic system 100 in case one or more of the power modules need to be removed for maintenance or repair. That is, chassis 102 of the electronic system 100 can contain at least N number of power modules where N is the number of power modules required to operate the load. For example, chassis 102 can accommodate a number of power modules that is greater than N so that when one or more of the power supplies is removed, the remaining power supplies can continue to operate the load during a hot-swapping operation.

The term "hot-swapping" refers to the ability to remove a powered power module, or alternatively insert an unpowered power module, while maintaining a predetermined voltage regulation of the electronic system 100. For example, power module 120 can be removed within electronic system 100 and may temporarily reduce the system power voltage level within an acceptable limit while other power modules, for example power modules 122, 124, remain in operation in the electronic system 100. Alternatively, power module 120 may be unpowered and inserted into the backplane 110 of a powered electronic system 100 and the instantaneous current required to charge the unpowered power module 120 can cause the voltage of the electronic system to temporarily drop, although while again maintaining the predetermined voltage regulation.

In one embodiment, the electronic system 100 includes a release control, for example release control 150, 152, 154, associated with each of the power modules 120, 122, 124, respectively. The release control of each power modules impacts the time in which the power modules can be removed from the electronic system. When a power module, for example power module 120, is to be removed, the release control increases the time to disconnection of the power supply when the output voltage connector is disconnected from the backplane 110, and therefore, increases the time available to transition current from a power module being removed, for example power module 120, to the power modules which maintain connection, for example power modules 122, 124.

Acceptable supply voltage levels provided by power modules 120, 122, 124, may vary, but voltage regulation according to an embodiment of the invention can usually be maintained within about 10% of the operating voltage, for example, to allow for proper functioning of circuitry of the electronic system. The electronic system, in accordance with the various example embodiments described herein, can allow for current transitioning during hot-swapping such that the power module 120 being removed has a reduced voltage level. For example, the reduced voltage level may upon electrical disconnection of the power module 120 can be within about 90% or less of the operating voltage, in alternative embodiments less than about 10% or less of the operating voltage, and in yet alternative embodiments, about 1% or less of the operation voltage prior to electrical disconnection. The reduction in voltage level of the power module 120 being removed is application dependent and in some instances may only be slightly reduced from the operating voltage upon electrical disconnection.

Figure 2:
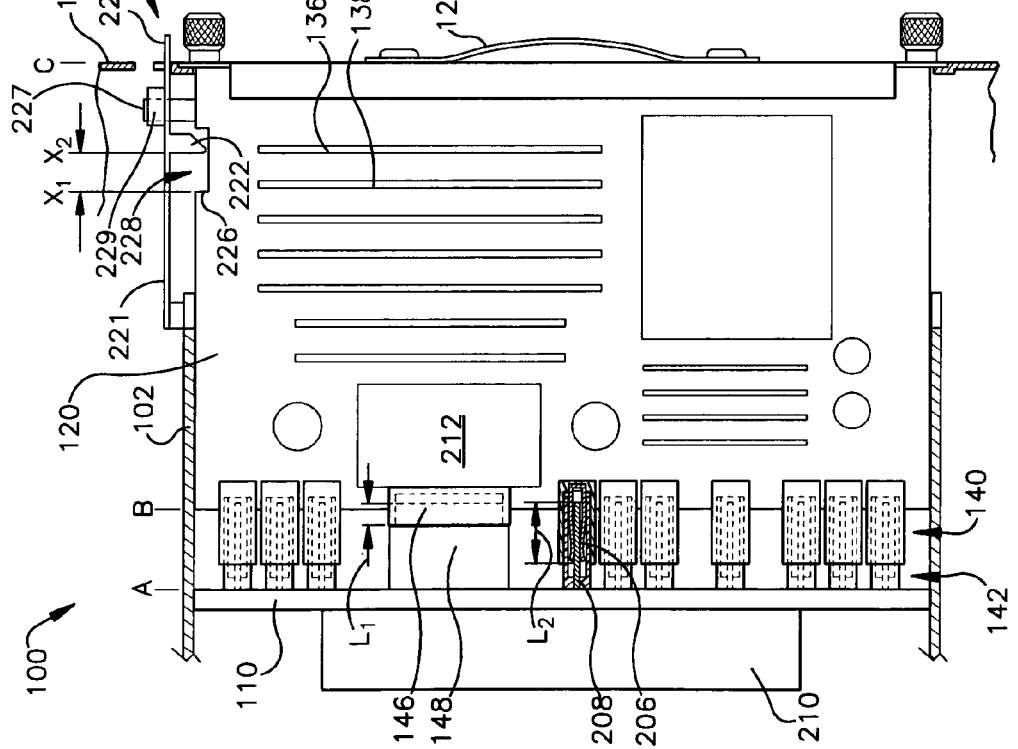
FIG. 2 is a cross-sectional view of the electronic system of FIG. 1 along lines 2-2 showing a power module in an enabling position and a release control internal to the chassis according to an embodiment of the present invention.

FIG. 2 is a cross-sectional view of the electronic system of FIG. 1 along lines 2-2 showing power module 120 engaged in electrical communication with the backplane 110 of the electronic system 100, according to an embodiment of the present invention. In one embodiment the electronic system 100 has a release control 150 that restricts movement of the power module 120 when the first power module 120 is moved away from the backplane 110 beyond a disabling position, and power modules 122, 124 remain connected to the backplane 110. By the term "restrict" herein is meant to limit the movement of the power module 120, at least temporarily, by causing the power module 120 to slow or even stop for a time period during extraction, as will be further described.

Figure 3:
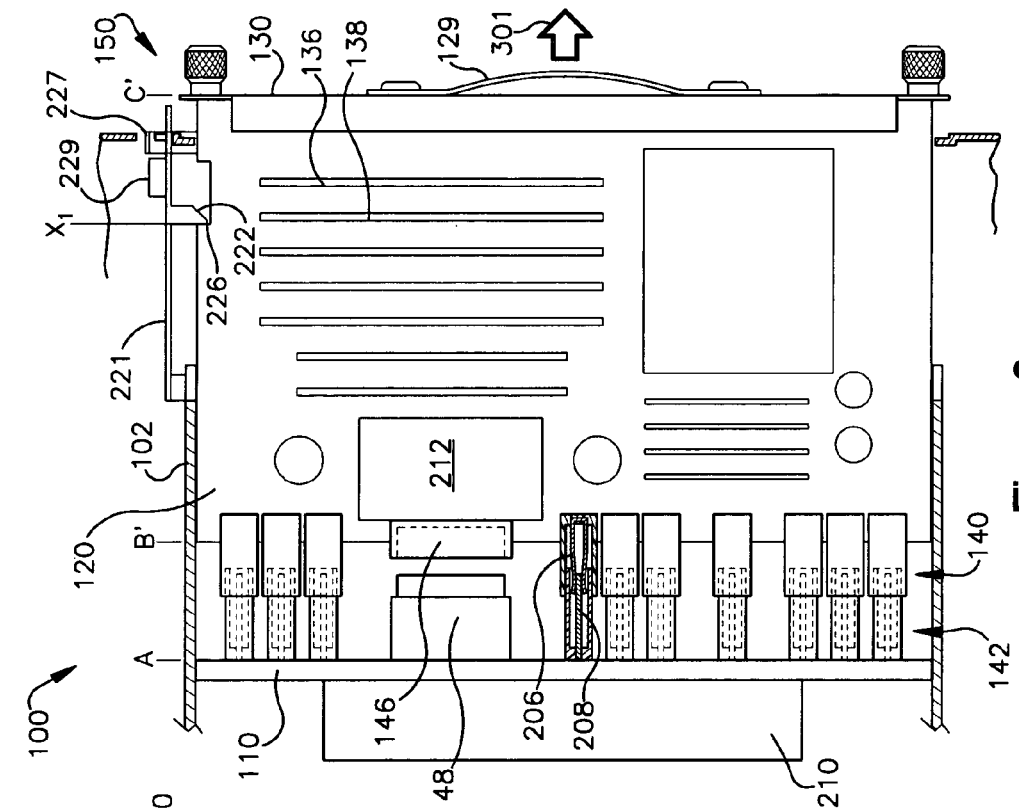
FIG. 3 is a cross-sectional view of the electronic system of FIG. 2 showing the power module in the disabling position, according to an embodiment of the present invention.
Figure 4:
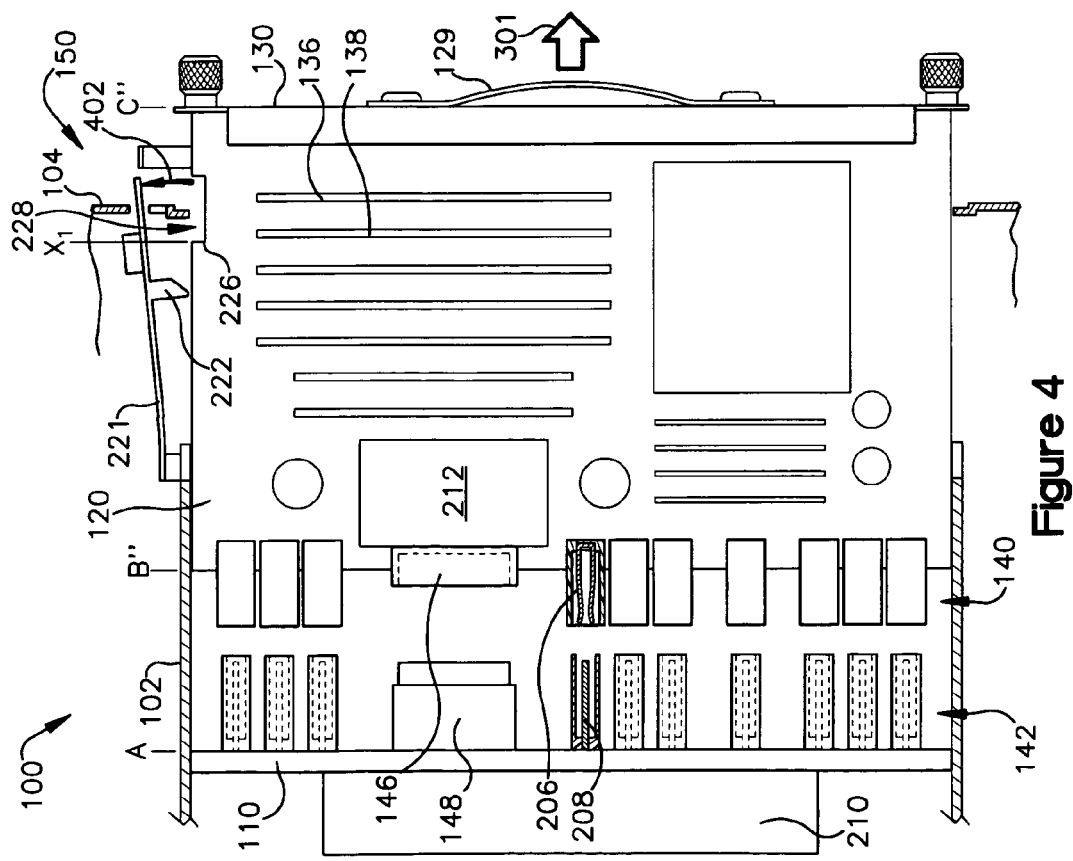
FIG. 4 is a cross-sectional view of the electronic system of FIG. 3 in the disconnected position, according to an embodiment of the present invention.

FIGS. 2 through 4 show the power module 120 as it moves from being in physical communication with the backplane 110 and enabled, to being electrically disconnected from the backplane 110. In FIG. 2 the plurality of output voltage and ground connectors 140 are connected to the plurality of mating output voltage and ground connectors 142 electrically connected to the backplane 110, and the signal connector 146 is connected to the mating signal connector 148 attached to the backplane 110 when the power module 120 is fully engaged with the backplane 110. The backplane 110, and the front and rear of the power module 120 are in positions A, B and C, respectively. Load 210 is shown connected to the backplane 110 opposite the output voltage and ground connectors 140, 142. The load can include, but is not limited to, a chip component, an ASIC, a processor, for example.

The signal connectors 146, 148 and the output voltage connectors, for example, output voltage connectors 206, 208, have different lengths of connection, $L_1$ and $L_2$, respectively, with the length of connection $L_1$ of the signal connector 146 and mating signal connector 148 being shorter than the length of connection $L_2$ of the output voltage connector 206 and mating ouput voltage connector 208. Output voltage connectors 206, 208 can be assumed to be one of the plurality of the positive voltage and ground connectors 140, 142 having the greatest length of electrical contact relative to the backplane 110. For example, when power module 120 is pulled away from the backplane 110, the output voltage connectors 206, 208 will be the last of the positive voltage connectors supplying voltage to the backplane 110 to disconnect.

When the power module 120 is pulled away from the backplane 110, the difference in the lengths of connection $L_2$-$L_1$, causes an automatic time delay between disconnection of the signal connectors 146, 148, when the power module 120 initiates a disabling function, and disconnection of the output voltage connectors 206, 208, when the power module is disconnected. This time delay allows the signal connectors 146, 148 to send a trigger that allows for disabling of one or more converters, for example converters 136, 138, and reduces the current delivered to the backplane 110 prior to disconnecting the power module 120 from the backplane 110.

Electronic system 100 can also include a power manager 212 that controls the shutdown of converters 136, 138. The signal connectors 146, 148, can directly disconnect a converter, or a series of converters 136, 138, as described above, and can also disconnect the power manager 212 that can disconnect the converters 136, 138, directly or sequentially, for example. The time for disabling the converters can be, for example, tens or hundreds of milliseconds or longer. The amount of time delay between disconnection of the signal connectors 146, 148, and disconnection of the output voltage connectors 206, 208, can depend on the speed of extraction, the difference in lengths of connection of the signal connectors 146, 148, and the output voltage connectors 206, 208, i.e. $L_2$-$L_1$, as well as the design of the release control 150, as will be further described below.

In FIG. 2 the release control 150 has a lever 220 and a protrusion 222 that can be moved by the lever 220. The protrusion 222 is shown residing in a recess 228 of the power module 120 at location $X_2$, a predetermined distance from a contact point 226 of the recess 228 at location $X_1$, where locations $X_1$ and $X_2$ are distances along an axis relative to the backplane 110. The distance between the protrusion 222 of the release control 150 and the interference point 226 of the power module 120, i.e. the distance $X_2$-$X_1$, is greater than the length of connection $L_1$ of the signal connectors 146, 148, and is also less than the distance required to electrically disconnect the output voltage connector, i.e. the approximate length $L_2$ of the output voltage connector. That is, the distance $X_2$-$X_1$ is greater than $L_1$ and less than $L_2$-$L_1$.

In addition, the release control 150 includes a clinch 227 with a retaining portion that prevents the lever 220 from being lifted until the power module 120 has been pulled out of the chassis 102 by a predefined distance. In one embodiment, the lever 220 includes a contact protrusion 229 that provides for a surface that is adjacent to the retaining portion of the clinch 227. The proximity of the retaining portion of the clinch 227 to the surface of the contact protrusion 229 prevents the lever 220 from being actuated to release the power module 120 until the contact protrusion 229 is clear of the clinch 227. As shown in FIG. 2, the clinch 227 prevents the lever 220 from being lifted. In FIG. 3, the power module 120 is pulled out to the point at which the contact protrusion 229 is clear of the clinch 227. Thus, as shown in FIG. 3, the lever 220 may be raised so as to release the power module 120 since the contact protrusion 229 is clear of the clinch 227. In this manner, a user is prevented from raising the lever 220 before the contact protrusion 229 is clear of the clinch 227. This ensures that the user cannot simply raise the lever 220 and pull the power module 120 from the chassis 102 without pausing or stopping the power module 120 as described herein.

Referring back to FIG. 1, the front panel 104 includes a gap 230 that allows the clinch 227 (FIGS. 2 and 3) to exit through the front panel 104 when the power module 120 is pulled from the chassis 102.

FIG. 3 shows power module 120 once it has been moved along an axis in the direction indicated by arrow 301 with the front and rear of power module moved to positions B' and C', respectively. Power module 120 is in the disabling position, where the signal connector 146 has been moved a distance greater than $L_1$ such that the signal connector 146 is disconnected from the mating signal receptor 148, while the output voltage connector 206 remains connected to the mating output voltage connector 208 of the backplane 110. Disconnection of the signal connectors 146, 148, can trigger the power module 120 to disable converters 136, 138, that would otherwise provide current to the electronic system 100. The contact between the protrusion 222 of the release control 150 and the contact point 226 of the power module 120 causes the power module 120 to stop, at least momentarily, to prevent disconnection of the output voltage connectors 206, 208, from the backplane 110. This arrest in the power module 120 delays the disconnection of the power module 120 from the backplane 110 and allows additional time for the power module 120 to power-down before it is electrically disconnected.

FIG. 4 shows that release control 150 once it has been moved out of contact with the power module 120 and advanced along the axis indicated by arrow 301 with the front and rear of power module moved to positions B" and C", respectively. The power module 120 is electrically disconnected from the backplane 110. Once the protrusion 222 of the release control 150 has been moved out of contact with the contact point 226 of the recess 228 of power module 120, the power module 120 is free to move to disconnect the output voltage connector 206 from the mating output voltage connector 208 on the backplane 110. The lever 221 of the release control 150 can be made of a flexible material or designed to flex in the direction indicated by arrow 402 along the front panel 104 of the chassis 102, to the extent that the protrusion 222 of the release control 150 can clear the contact point 226 of the power module 120. The lever 221 of the release control 150 can be moved by one of many alternative methods. For example, an operator can contact the lever 221 directly, and as another example, an operator can contact a push button (not shown) that mechanically or electrically controls the movement of the release control 150 such that protrusion 222 is moved out of contact with the power module 120.

Figure 5:
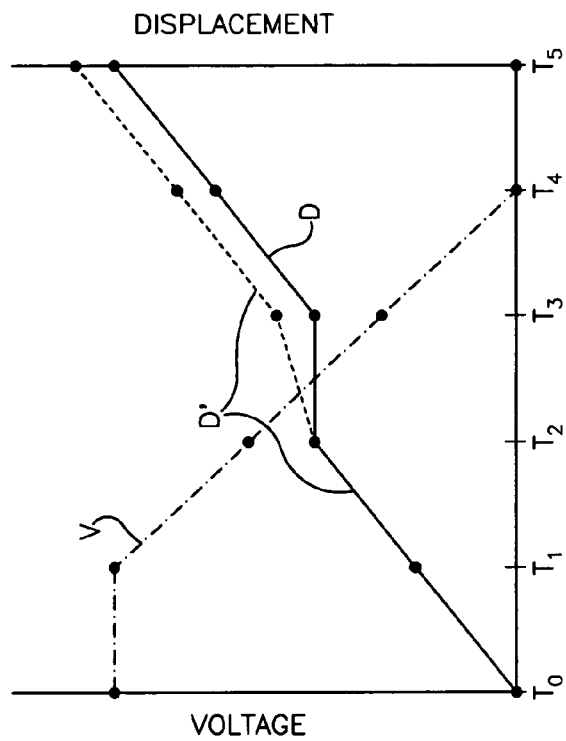
FIG. 5 is a graph of the general pattern of change in voltage and displacement as a function of time of the power module shown in FIGS. 2-4, according to an embodiment of the invention.

The graph of FIG. 5 illustrates the general pattern of change in voltage along voltage curve V, and the changes in displacement of the power module 120 along displacement curve D as a function of time, according to an embodiment of the invention shown in FIGS. 2-4 described above. At time $T_0$ when the power module is enabled and the output voltage connector 202 and signal connector 146 are connected to the backplane 110 the voltage is at a predetermined initial voltage and the power module 120 resides at a predetermined distance from the backplane 110. At time $T_1$ upon movement of the power module 120 away from backplane 110, the signal connector 146 is disconnected from the mating signal connector 148 of the backplane, thereby placing the power module 120 is in a disabling position, and the voltage is decreased. At time $T_2$ the release control 150 stops the movement of the power module 120 and the displacement along the axis is held constant until at time $T_3$ the release control 150 no longer obstructs the movement of the power module 150. Once the release control 150 is disengaged, deactivated, or otherwise no longer obstructs the movement of power module 120 at time $T_3$ the power module 120 can be moved further away from backplane 110 while the power module 120 remains in electrical communication with the backplane 110 via output voltage connectors 206, 208. At time $T_4$ the voltage of the power module 120 can drop substantially, for example to a voltage that is substantially zero, prior to further displacement of the power module 120 and disconnection of the output voltage connector 206 and mating output voltage connector 208 at time $T_5$.

Therefore, in the example embodiment described above, the presence of the release control 150 increases the amount of time between disconnection of the signal connectors 146, 148, and disconnection of the output voltage connectors 206, 208, thereby increasing the amount of time available to disable the one or more converters 136, 138, or to otherwise gradually reduce the voltage prior to electrical disconnection of the power module 120 from the backplane 110. This can provide additional time for gradual transitioning of current from power module 120 that is being removed to one or more power modules, for example power modules 122, 124, (FIG. 1) which remain connected to the backplane 110.

As described above, the actual decrease in voltage of the power module 120 upon disconnection of the output voltage connectors 206, 208, is application-specific, and it may not be necessary that the voltage drop substantially prior to disconnection of the power module 120 to allow for proper functioning of circuitry of the electronic system.

Figure 6:
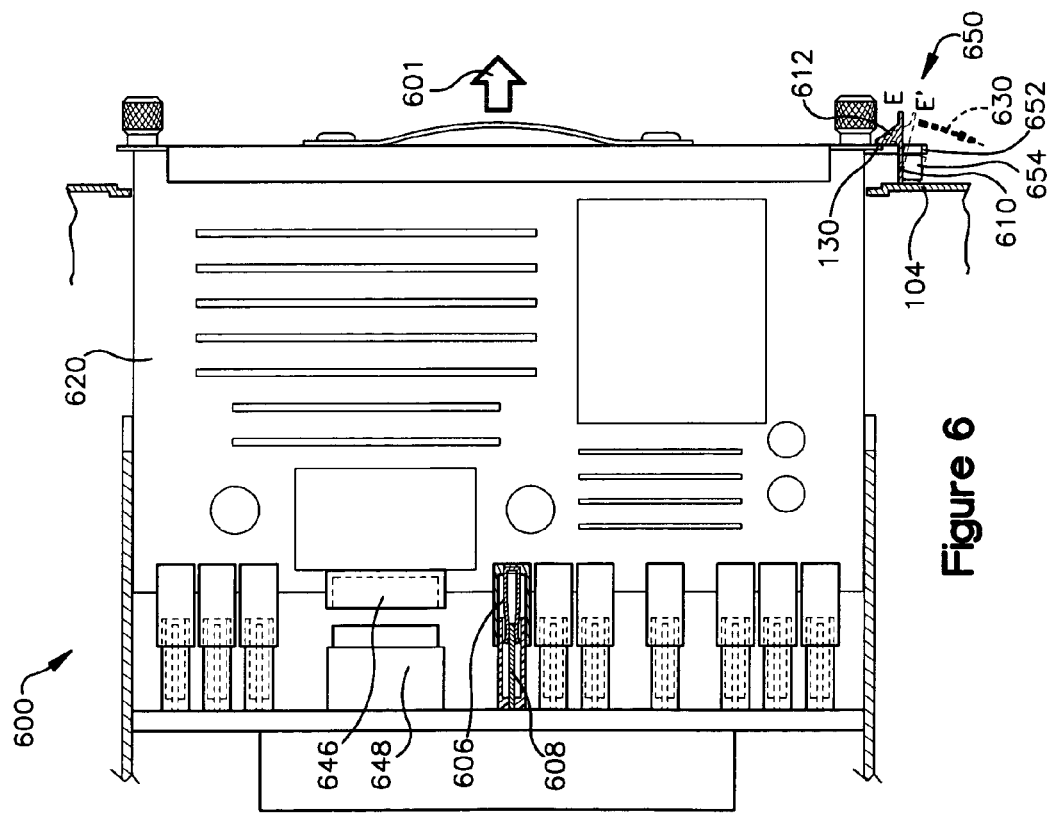
FIG. 6 is a cross-sectional view of the electronic system showing a power module in the disabling position and a release control external to the chassis, according to an embodiment of the present invention.

FIG. 6 is a cross-sectional view of electronic system 600 showing power module 620 according to another embodiment of the present invention. In such case, chassis 102 includes release control 650, which can be in physical communication with the front panel 104 of chassis, and which comes into contact with the power module 620 at a location that is external to the chassis 102. For example, the release control 650 can include a flexible spring tab 610 having a protrusion 612 that can be moved in and out of interference with the power module 620. FIG. 6 shows that the protrusion 612 of the release control 650 comes into contact with the power module 620, for example the faceplate 130, after the power module has been pulled in the direction indicated by arrow 601 into a disabling position in which the signal connector 646 is disconnected from the mating signal connector 648 and the output voltage connector 606 remains connected to the mating output voltage connector 606 attached to the backplane 110. The protrusion 612 of the release control 650 shown located at position E can be moved in the direction indicated by arrow 630 (shown in phantom) to a release position at position E' (shown in phantom) such that the release control 650 is moved out of contact with the power module 620. The power module 620 can then continue to be moved along the same axis in a direction indicated by arrow 601 to disconnect output voltage connector 606 from the mating output voltage connector 608 so that the power module 620 is disconnected from the backplane 110. A clinch 652 and a contact protrusion 654 are provided on the release control 650 to ensure that a user does not pull the power module 620 without a desired pause as described herein.

Figure 7A:
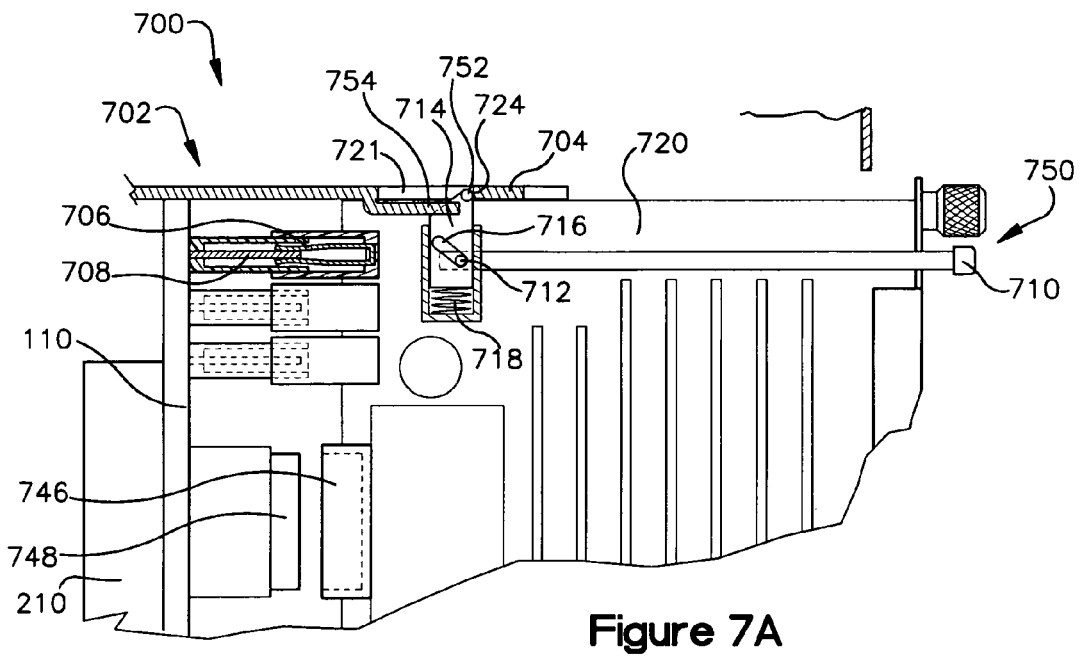
FIG. 7A is a cross-sectional view of an electronic system showing a power module in the disabling position and a release control in physical communication with the power module, according to an embodiment of the present invention.
Figure 7B:
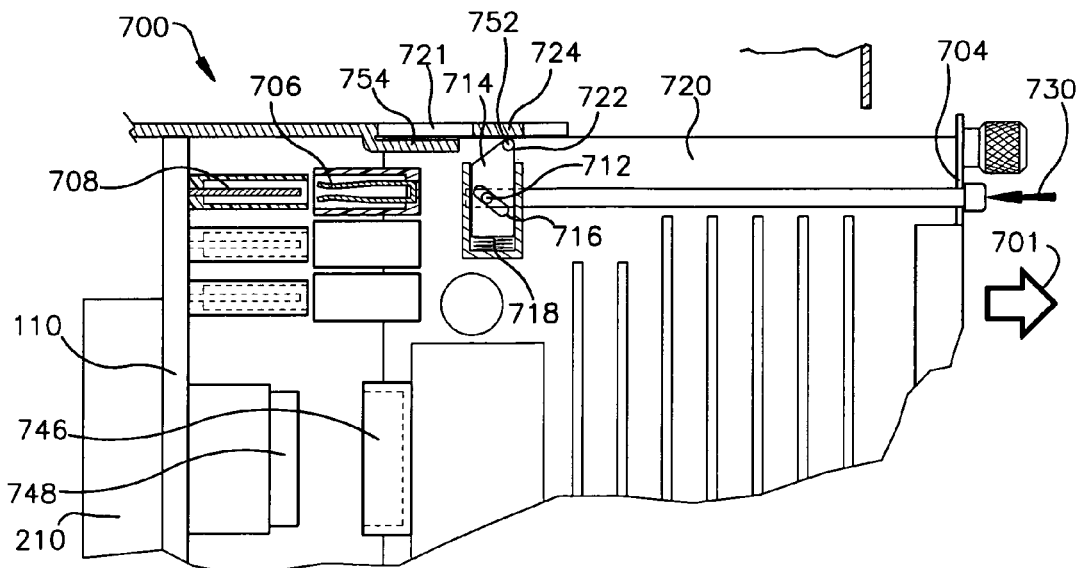
FIG. 7B is a cross-sectional view of the electronic system of FIG. 7A showing the power module in the disconnected position, according to an embodiment of the present invention.

FIGS. 7A and 7B show electronic system 700 in which the electronic module 720 includes a release control 750 in physical communication with power module 720 according to an alternative embodiment of the present invention. Release control 750 includes a button 710, a pin 712, a protrusion 714 having an opening 715 with an angled edge 716, and a spring 718. The pin 712 is in physical communication with the protrusion 714 against the angled edge 716 of the opening 715. In FIG. 7A the spring is biased such that protrusion 714 resides against front panel 704 of chassis 702. As shown, protrusion 714 of the release control 750 extends through an opening 721 of front panel 704 of chassis 702. Protrusion 714 contacts interference point 724 of chassis 702, when the signal connector 746 is disconnected from the mating signal connector 748 while the output voltage connector 706 and the mating output voltage connector 708 remain electrically connected to the backplane 110. In addition, a pin 752 extends from the protrusion 714 and slides along a clinch 754 as the power module 720 is pulled from the chassis 702. When the pin 752 is clear of the clinch 754, the protrusion 714 is able to be released from the interference point 724. This prevents a user from releasing the protrusion 714 prematurely while pulling the power module 720 from the chassis 702.

In FIG. 7B when button 710 is pushed in the direction indicated by arrow 730, pin 712 is forced to move along angled edge 716 of opening 715 and protrusion 714 is forced in a direction that compresses spring 718. The protrusion 714 of the release control 750 is thereby cleared away from front panel 704 of chassis 702 and the electronic module 720 is free to move along the axis in a direction indicated by arrow 701 to disconnect the output voltage connector 706 from the output voltage receptor 708 of the backplane 110. The time delay from the time of disconnection of the signal connectors 746, 748, shown in FIG. 7A to the disconnection of the output voltage connectors 706, 708, shown in FIG. 7B can be greater than the time it takes to transition some or substantially all electric current from power module 720 for safe disconnection.

Figure 8:
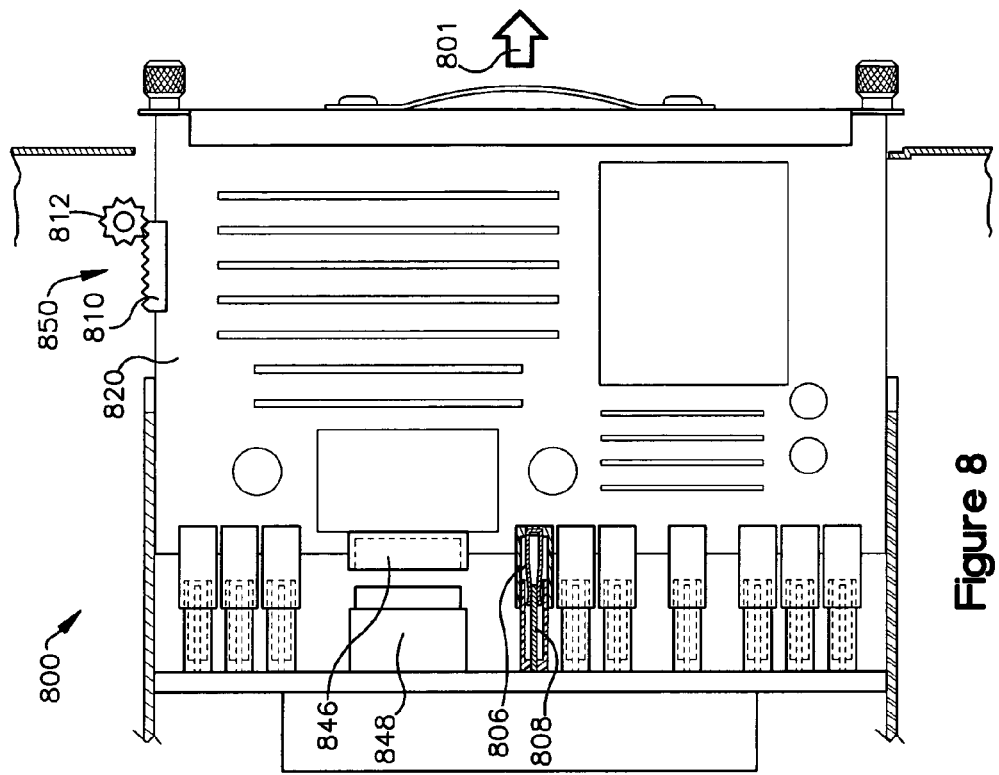
FIG. 8 is a cross-sectional view of an electronic system showing a power module in the disabling position and having a release control in physical communication with the power module and the chassis, according to an embodiment of the present invention.

FIG. 8 is a cross-sectional illustration electronic system 800 in which the release control 850 restricts movement of the power module 820 by decelerating the movement of the power module 820 away from the backplane 110, according to another embodiment of the present invention. Release control 850 includes a geared rack 810 which is engaged in relative motion to a geared pinion 812. The geared rack 810 comes into contact with the geared pinion 812 to slow the movement of the power module 820 at some point between the time when the signal connectors 846, 848, are disconnected and the output voltage connectors 806, 808 are disconnected. This time delay can be greater than the time it takes to power-down the power module 820 such that the voltage of the power module 820 is at a low enough level to safely electrically disconnect the power module 820 from the load electrically connected to the backplane 110. The example embodiment of FIG. 8 shows that the geared rack 810 in physical communication with the power module 820 and the geared pinion 812 in physical communication with the chassis 102. In an alternative example embodiment, the geared rack 810 can be in physical communication with the chassis 102 and the geared pinion 812 can be in physical communication with the power module 820.

Referring back to the graph shown in FIG. 5, the general pattern of change in voltage along voltage curve V and the change in displacement along displacement curve D' of the power module 820 is illustrated as a function of time, consistent with the example embodiment of the invention described above with respect to FIG. 8. At time $T_2$ the release control 850 is engaged to slow the movement of the power module 820 until at time $T_3$ the release control is disengaged, deactivated, or otherwise no longer has impact on the speed of extraction when, for example, the geared pinion 812 is cleared from the geared rack 810 (FIG. 8) at time $T_3$. Therefore the rate of displacement of the power module 820 between $T_2$ and $T_3$ is less than the rate of displacement between $T_1$ and $T_2$ and is less than the rate of displacement between $T_3$ and $T_4$, as represented by the different slopes in the respective portions of curve D'. This is contrasted to the example embodiments described above with respect to FIGS. 2-4, 6, and 7, in which the release control 150, 650, 750, stops the movement of the power module during extraction as represented by the flat portion of curve D between times $T_2$ and $T_3$. After time $T_3$ the power module 820 can resumes displacement until time $T_5$ in which the power module 820 is disconnected from the backplane 110.

In the various example embodiments described above, the method for removing a power module from an electronic system includes moving a power module along an axis away from a backplane to electrically disconnect the signal connectors and engaging a release control while the output voltage connectors of the power module are connected. The disconnection of the signal connectors in a disabling position initiates the power-down mode to reduce the current within the power module, for example by disabling one or more converters, and the release control restricts the movement of the power module along the axis. In another embodiment, the method further includes disengaging the release control and disconnecting the output voltage connectors from the load.

Although the invention is shown and described with respect to certain embodiments, it is obvious that equivalents and modifications will occur to others skilled in the art upon the reading and understanding of the specification. The present invention includes all such equivalents and modifications, and is limited only by the scope of the claims.

What is claimed is:

1. An electronic system comprising:
   a first power module that supplies power to a load external to the first power module through an output voltage connector in an enabling position, the first power module supported by a chassis through a front panel of the chassis and is movable extractable from the chassis along an axis from the enabling position in which a signal connector and the output voltage connector are connected to a disconnected position in which the first power module is disconnected from the load without removal of the front panel from the chassis, the chassis being external to the first power module; and
   a release control that restricts the movement of the first power module along the axis after the first power module is moved past a disabling position in which the first power module is triggered by disconnection of the signal connector to reduce the power supplied to the load while the first power module remains connected to the load through the output voltage connector when restricted by the release control, the disabling position located between the enabling position and the disconnected position in which the signal connector and the output voltage connector are disconnected, wherein the release control does not restrict the movement of the first power module from the enabling position to the disabling position, the release control comprising a protrusion that contacts the chassis causing the first power module to stop when the first power module is moved along the axis to a position between the disabling position and the disconnected position.

2. The electronic system of claim 1, further comprising:
a second power module that supplies power to the load and is in electrical communication with the first power module; and
wherein the second power module is configured to increase power to the load when the first power module is moved to the disabling position.

3. The electronic system of claim 1, wherein:
the first power module comprises the signal connector and the output voltage connector, the length of the signal connector being shorter than the length of the output voltage connector; and
the release control restricts the movement of the first power module along the axis when the signal connector is disconnected and the output voltage connector is connected to the load.

4. The electronic system of claim 1, wherein the power output provided by the first power module is less than about 90% or less of an operating voltage of the electronic system when the first power module is disconnected from the load.

5. The electronic system of claim 1, wherein the release control further comprises a spring configured to urge the protrusion of the release control toward the chassis.

6. An electronic system comprising:
a first power module that supplies power to a load external to the first power module through an output voltage connector in an enabling position, the first power module supported by a chassis through a front panel of the chassis and is movable extractable from the chassis along an axis from the enabling position in which a signal connector and the output voltage connector are connected to a disconnected position in which the first power module is disconnected from the load without removal of the front panel from the chassis: and
a release control that restricts the movement of the first power module along the axis after the first power module is moved past a disabling position in which the first power module is triggered by disconnection of the signal connector to reduce the power supplied to the load while the first power module remains connected to the load through the output voltage connector when restricted by the release control, the disabling position located between the enabling position and the disconnected position in which the signal connector and the output voltage connector are disconnected, wherein the release control does not restrict the movement of the first power module from the enabling position to the disabling position, and the release control comprises a protrusion that contacts the first power module causing it to stop when the first power module is moved along the axis to a position between the disabling position and the disconnected position.

7. The electronic system of claim 6, wherein the release control further comprises a recess in the power module configured to contact the protrusion at the position between the disabling position and the disconnected position.

8. An electronic system comprising:
a first power module that supplies power to a load external to the first power module through an output voltage connector in an enabling position, the first power module supported by a chassis through a front panel of the chassis and is movable extractable from the chassis along an axis from the enabling position in which a signal connector and the output voltage connector are connected to a disconnected position in which the first power module is disconnected from the load without removal of the front panel from the chassis; and
a release control that restricts the movement of the first power module along the axis after the first power module is moved past a disabling position in which the first power module is triggered by disconnection of the signal connector to reduce the power supplied to the load while the first power module remains connected to the load through the output voltage connector when restricted by the release control, the disabling position located between the enabling position and the disconnected position in which the signal connector and the output voltage connector are disconnected, wherein the release control does not restrict the movement of the first power module from the enabling position to the disabling position, and the release control comprises a rack and a pinion that come into contact with one another after the first power module is extracted past the disabling position causing the first power module to decelerate when it is moved along the axis between the disabling position and the disconnected position.

9. An electronic system comprising:
a first power module that supplies power to a load external to the first power module through an output voltage connector in an enabling position, the first power module supported by a chassis through a front panel of the chassis and is movable extractable from the chassis along an axis from the enabling position in which a signal connector and the output voltage connector are connected to a disconnected position in which the first power module is disconnected from the load without removal of the front panel from the chassis;
a release control that restricts the movement of the first power module along the axis after the first power module is moved past a disabling position in which the first power module is triggered by disconnection of the signal connector to reduce the power supplied to the load while the first power module remains connected to the load through the output voltage connector when restricted by the release control, the disabling position located between the enabling position and the disconnected position in which the signal connector and the output voltage connector are disconnected, wherein the release control does not restrict the movement of the first power module from the enabling position to the disabling position; and
a clinch that prevents disengaging a release of the release control power module without restriction of the movement of the first power module, wherein the release control restricts movement of the first power module along the axis by causing the first power module to stop.

10. A method comprising:
moving a power module of an electronic system along an axis to disconnect a signal connector of the power module, wherein the electronic system comprises a chassis external to the power module;
reducing power supplied through an output voltage connector of the power module to a load in response to the disconnection of the signal connector;
engaging a protrusion of a release control with the chassis after the signal connector is disconnected and while the output voltage connector of the power module remains connected to the load; and preventing the disengaging of the protrusion of the release control until after the signal connector is disconnected.

11. The method of claim 10, further comprising:
disengaging the release control after the signal connector is disconnected; and
disconnecting the output voltage connector of the power module from the load after the release control is disengaged.

12. The method of claim 11, wherein deactivating the power module comprises moving the power module out of contact with the chassis of the electronic system.

13. The method of claim 11, wherein the power output provided by the power module is less than about 90% or less of an operating voltage of the electronic system when the output voltage connector is disconnected from the load.

14. An electronic system comprising:
a first power module that supplies voltage to a load external to the first power module through an output voltage connector in an enabling position, the first power module supported by a chassis through a front panel of the chassis and movable along an axis from the enabling position in which a signal connector and the output voltage connector are connected to a disconnected position in which the first power module is disconnected from the load without removal of the front panel from the chassis; and
a means for restricting movement of the first power module when the first power module is moved beyond a disabling position in which the first power module is triggered by disconnection of the signal connector to reduce power supplied to the load while the first power module is still connected to the load through the output voltage connector when restricted by the means for restricting movement, the disabling position located between the enabling position and the disconnected position in which the signal connector and the output voltage connector are disconnected without restricting movement of the first power module between the engaged position and the disabling position, wherein the means for restricting movement of the first power module along the axis comprises means for interfacing the first power module with a chassis of the electronic system to slow the movement of the first power module relative to the chassis after the first power module is moved past the disabling position.

* * * * *